United States Patent
Higuchi et al.

(10) Patent No.: US 7,752,747 B2
(45) Date of Patent: Jul. 13, 2010

(54) MANUFACTURING METHOD OF ELECTRONIC COMPONENT

(75) Inventors: Masato Higuchi, Kanazawa (JP); Hideki Shinkai, Kanazawa (JP); Osamu Ishikawa, Fussa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 779 days.

(21) Appl. No.: 10/595,988

(22) PCT Filed: Dec. 7, 2004

(86) PCT No.: PCT/JP2004/018211

§ 371 (c)(1), (2), (4) Date: May 24, 2006

(87) PCT Pub. No.: WO2005/071731

PCT Pub. Date: Aug. 4, 2005

(65) Prior Publication Data

US 2008/0313895 A1    Dec. 25, 2008

(30) Foreign Application Priority Data

Jan. 22, 2004    (JP)    ............................. 2004-014492

(51) Int. Cl.
*H05K 3/30* (2006.01)

(52) U.S. Cl. .............................. 29/832; 29/841; 29/848; 29/855; 29/856; 264/1.7; 264/1.9; 264/272.14; 264/272.15; 264/272.17; 257/777; 257/737; 257/778; 257/780; 257/723; 438/106; 438/127

(58) Field of Classification Search ................... 264/1.7, 264/1.9, 272.14, 272.15, 272.17; 257/777, 257/737, 778, 780, 723; 438/106, 127; 29/832, 29/841, 848, 855, 856
See application file for complete search history.

(56) References Cited

U.S. PATENT DOCUMENTS 5,635,115 A * 6/1997 Konishi et al. ............... 264/1.7

(Continued)

FOREIGN PATENT DOCUMENTS

CN    1119343 A    3/1996

(Continued)

OTHER PUBLICATIONS

International Search Report issued in corresponding International Application No. PCT/JP2004/018211, mailed Apr. 19, 2005.

(Continued)

*Primary Examiner*—Derris H Banks
*Assistant Examiner*—Azm Parvez
(74) *Attorney, Agent, or Firm*—Keating & Bennett, LLP

(57) ABSTRACT

A method of manufacturing an electronic component minimizes the occurrence of voids and degradation of characteristics in a resin-sealed portion, while reducing the costs thereof. A sealing step for sealing surface acoustic wave elements by a sealing resin member formed from a resin film is performed by mounting the surface acoustic wave elements on a collective mounting substrate and the resin film in a bag with a gas-barrier property, and causing the resin film to infiltrate between the surface acoustic wave elements mounted on the reduce-pressured-packed collective mounting substrate to be hermetically sealed by the pressure difference between the inside and the outside of the bag.

10 Claims, 9 Drawing Sheets

U.S. PATENT DOCUMENTS 6,376,915 B1 * 4/2002 Hikita et al. ................. 257/777
6,492,194 B1 * 12/2002 Bureau et al. ............... 438/106

FOREIGN PATENT DOCUMENTS

| | | |
|---|---|---|
| EP | 0684648 A2 | 11/1995 |
| JP | 06-293364 A | 10/1994 |
| JP | 08-045972 A | 2/1996 |
| JP | 2000-306810 A | 11/2000 |
| JP | 2001-028376 A | 1/2001 |
| JP | 2001-94042 A | 4/2001 |
| JP | 2001-176995 A | 6/2001 |
| JP | 2002-217219 A | 8/2002 |
| JP | 2002-319650 A | 10/2002 |
| JP | 2002-324815 A | 11/2002 |
| JP | 2003-017979 A | 1/2003 |
| JP | 2003-032061 A | 1/2003 |
| JP | 2003-229456 A | 8/2003 |
| JP | 2003-264442 A | 9/2003 |
| JP | 2003-338474 A | 11/2003 |

OTHER PUBLICATIONS

Official communication issued in the counterpart Korean Application No. 10-2006-7010121, mailed on May 1, 2007.
Official communication issued in counterpart Japanese Application No. 2005-517197, mailed on Jun. 10, 2008.
Official communication issued in the counterpart Chinese Application No. 200480034058.2, mailed on Aug. 24, 2007.
Official communication issued in counterpart German Application No. 11 2004 002 236.3, mailed on Oct. 31, 2007.

* cited by examiner

MANUFACTURING METHOD OF ELECTRONIC COMPONENT

BACKGROUND OF THE INVENTION

1. Field of the Invention

The present invention relates to a method of manufacturing an electronic component using a lamination chip size package (CSP), which is a type of CSP, in which a resin film is buried by performing heat pressing on an electronic functional element such as a surface acoustic wave (SAW) element bonded to a substrate.

2. Description of the Related Art

In the related art, in order to attain a compact and low profile package of a SAW filter, chip size packages (CSPs) with various kinds of structures have been developed. It is required for the CSP of the SAW filter to be sealed with a resin with a space formed around the vibration portion of the filter to allow for unhindered vibration of the SAW element.

As for a method of manufacturing such a resin-sealed package, a heat pressing process is known. Japanese Unexamined Patent Application Publication No. 2003-17979 and Japanese Unexamined Patent Application Publication No. 2003-32061 disclose a sealing technology that uses the heat pressing process. In these publications, a SAW element is mounted on a packaging substrate by flip-chip bonding so that a vibration space is formed between the packaging substrate and the SAW element attached to the packaging substrate, and the mounted SAW element is then subjected to resin sealing by the heat pressing process.

However, during the sealing by the heat pressing process, voids due to air bubble entrapment tend to occur, thus causing the sealed state to be unstable. For example, there has been a tendency that, due to degradation of thermal stability during reflowing of solder, or moisture absorption over time, degradation of characteristics over time of the sealed SAW element, occurred. Moreover, when sealing was implemented in a vacuum, it was possible to prevent voids from occurring, however, a large-scale apparatus for placing the entire system in a vacuum has been required.

SUMMARY OF THE INVENTION

In order to overcome the problems described above, preferred embodiments of the present invention provide a method of manufacturing an electronic component which can be manufactured using a simple apparatus, and in which voids and degradation of characteristics over time are prevented from occurring.

A method of manufacturing an electronic component according to a preferred embodiment of the present invention includes a mounting step including mounting on a collective mounting substrate a plurality of electronic functional elements, each having a substrate and an electronic functional portion provided on the substrate, an arranging step including arranging a resin film on the electronic functional elements mounted on the collective mounting substrate, a reduced-pressure packing step for putting the electronic functional elements and the resin film mounted on the collective mounting substrate in a bag with a gas-barrier property, and hermetically sealing the contents inside the back by closing the opening of the bag after depressurizing the inside of the bag, a sealing step including sealing the electronic functional elements with a sealing resin member formed from the resin film by causing the resin film to infiltrate between the electronic functional elements mounted on the reduced-pressure-packed collective mounting substrate, and a dividing step including dividing the collective mounting substrate having the resin-sealed electronic functional elements into individual electronic functional elements.

According to the above-described method, since electronic functional elements are sealed within a bag under reduced pressure, by the sealing resin member formed from the resin film, it is possible to reduce the occurrence of voids due to inclusion of air in the sealing resin, and to prevent durability degradation such as strength degradation over time or degradation of characteristics due to moisture absorption.

Moreover, in the above-described method, since only the inside of the bag should be depressurized, the bag can be depressurized by use of a simple depressurizing apparatus. Accordingly, it is possible to eliminate the use of a known large-scale apparatus for depressurizing the entire system, thus, enabling cost reduction to be achieved.

In the above-described manufacturing method, the sealing step may include a curing step for causing the resin film to infiltrate between electronic functional elements and then heating the electronic functional elements and the collective mounting substrate individually covered with a sealing resin precursor formed from the resin film so that the sealing resin precursor is cured to form the sealing resin member, and the curing step may have a step for performing heating in a pressure-controlled hermetically sealed space.

According to the above-described method, the infiltration amount of the sealing resin can be controlled by implementing the curing step for curing by performing heating in the pressure-controlled hermetically sealed space, thus, enabling the infiltration amount to be adjustable.

In the above-described manufacturing method, the electronic functional element may be a surface acoustic wave element having a vibration portion as the electronic functional element preferably disposed on a piezoelectric substrate. In the manufacturing method, it is preferable, in the mounting step, for the vibration portion to have a space between itself and the collective packaging surface, and to be arranged so as to face the collective packaging surface.

The above-described method can ensure the existence of the space required between a portion which faces the vibration portion and the vibration portion by adjusting the infiltration amount of the sealing resin. As a result, the above-described method is suitable for manufacturing a surface acoustic device.

In the above-described manufacturing method, it is preferable that the resin film includes filler, in which the maximum particle size of the particle distribution of the filler is preferably larger than the gap between the electronic functional elements and the collective mounting substrate, and the filler preferably having particle sizes larger than the gap between the electronic functional elements and the packaging collective substrate is about 5 wt % or more with respect to the total amount of the filler.

According to the above-described method, the infiltration amount of the sealing resin can be adjusted by setting the characteristics of the filler as mentioned above, for example, the existence of the space required between the portion facing the vibration portion and the vibration portion, can be ensured, thus enabling suitability of the method for manufacturing the surface acoustic device.

In the above-described manufacturing method, the sealing step may further include a thermo-compression bonding step for heating the resin film to soften the resin film and for applying pressure to the resin film via a roller or a press machine or other suitable pressure applying element. According to the above-described method, applying pressure to the resin film via the roller or pressure applying element enables sealing by the resin film to be more rapid.

In the above-described manufacturing method, the arranging step may include a step for adhering a parting sheet on one surface of the resin film, and a step for arranging the resin film on the collective mounting substrate having an electronic functional element mounted thereon, so that the parting sheet side of the resin film faces the outside.

According to the above-described method, the parting sheet is arranged by heating during softening of the resin film or curing of the sealing resin formed from the resin film in such a way that adherence of the sealing resin and the bag can be avoided, thus enabling the manufacturing to be easier.

In the above-described manufacturing method, it is desirable for the surface roughness of the resin film side of the parting sheet to be in the range of about 0.01 μm to about 10 μm, for example. According to the above-described method, by causing the surface roughness of the resin film side of the parting sheet to be in the range of about 0.01 μm to about 10 μm, the surface roughness of the top of the sealing resin can also be in the range of about 0.01 μm to about 10 μm, thus enabling improvement of the recognition rate of printing with respect to the top.

In the above-described manufacturing method, the mounting step may be a flip-chip bonding step for mounting a plurality of the electronic functional elements through bumps by flip-chip bonding.

In the above-described manufacturing method, the bag should have a multi-layered structure having a thermoplastic resin layer as an innermost layer and a heat-resistant resin layer with a higher heat resistance and a gas-barrier property higher than those of the thermoplastic resin layer as an outermost layer. According to the above-described method, it is possible to provide the heat sealing property to the bag more surely by using a multi-layered structure for the bag.

As described above, the method of manufacturing an electronic component according to various preferred embodiments of the present invention preferably includes a reduced-pressure packing step for putting electronic functional elements mounted on a collective mounting substrate and a resin film in a bag with a gas-barrier property to seal the contents inside, and a sealing step for sealing the electronic functional elements with a sealing resin member formed from the resin film by causing the resin film to infiltrate between the electronic functional elements mounted on the reduced-pressure-packed collective mounting substrate by utilizing the pressure difference between the inside and the outside of the bag.

Therefore, since, in the above-described method, the occurrence of voids can be minimized due to the fact that the infiltration occurs under reduced pressure, and the durability degradation such as strength degradation over time or degradation of characteristics due to moisture adsorption can be prevented, and since only the inside of the bag should be under reduced pressure, the above-described method can achieve the reduced-pressure state by a simple depressurizing apparatus, eliminating the known large-scale apparatus for depressurizing the entire system, thus, resulting in cost reduction.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Figure 1A:
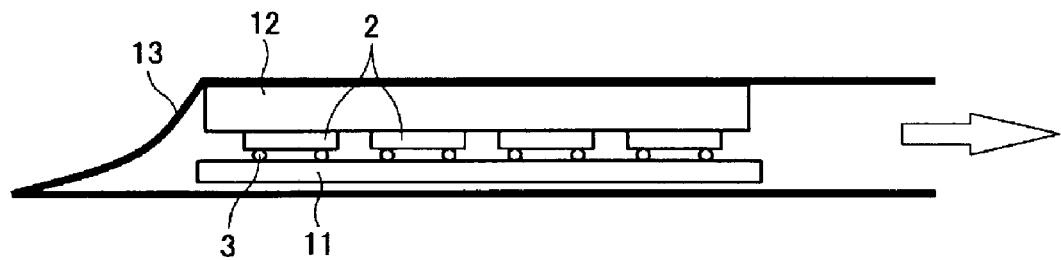
FIG. 1A to E are views showing steps of a method of manufacturing an electronic component according to a preferred embodiment of the present invention.

Hereinafter, based on FIGS. 1A to 9, the preferred embodiments of the present invention will be described on the basis of FIGS. 1A to 9.

First, in a SAW element CSP manufactured according to a method of manufacturing an electronic component of a preferred embodiment of the present invention, a SAW element (electronic functional element) 2 is mounted on a packaging substrate 1 by flip-chip bonding. In this case, in order not to disturb the vibration of the SAW element, the SAW element is mounted so as to ensure the existence of a space 5.

The packaging substrate 1 is preferably made of a material with an electric insulation property, for example, alumina, glass-epoxy etc., ceramics, resin, or other suitable material. The packaging substrate 1 is provided with lands 1a, or electrodes, for connection to the SAW element 2, on the surface facing the SAW element 2; via-holes 1b penetrating through the packaging substrate 1 in the thickness direction; and external terminals 1c each electrically connected to the corresponding land 1a through the corresponding via-hole 1b.

The SAW element 2 has at least one comb electrode portion as an electronic functional portion, or a vibration portion 2b, disposed on a piezoelectric substrate 2a. The vibration portion 2b in the SAW element 2 is a region through which surface acoustic waves propagate. As for bonding of bump electrodes 3 located on the packaging substrate 1 and the SAW element 2, or the land 1a, Au—Au bonding, solder bonding, plating bump bonding, or other suitable bonding method are suitable.

Moreover, the vibration portion 2b having a comb electrode portion is formed on a surface of the SAW element 2 facing the packaging substrate 1. The vibration portion 2b faces the space 5 formed according to the height of the bump electrode 3. Accordingly, due to the presence of the space 5, the excitation and propagation of the surface acoustic waves in the vibration portion 2b are not disturbed.

In this preferred embodiment, the gap between the SAW element 2 and the packaging substrate 1 is preferably set to be of the order of about 19 μm, for example. As for the gap, it should be set as required, and should not be interpreted as being specifically limited, however, it is preferable to be about 5 μm or more in this preferred embodiment of the present invention. If the gap is less than about 5 μm, the surface of the SAW element 2 and the packaging substrate 1 may come into contact with each other due to warping or unevenness, etc. of the packaging substrate 1.

Moreover, as mentioned above, the bump electrodes 3 electrically connect the SAW element 2 and the packaging substrate 1, however, in addition to the bump electrodes 3, a bump electrode for simply mechanically fixing the SAW element 2 to the packaging substrate 1 may be provided. Further, a bump electrode for maintaining the gap between the packaging substrate 1 and the SAW element 2 may be provided.

In the SAW element CSP, the SAW element 2 is covered with the sealing resin member 4. As for a material of the sealing resin member 4, it is not specifically limited as long as it has a sealing property and an adhesion property. However, for example, thermosetting or thermoplastic resin such as an epoxy-based, polyimide-based, polyolefin-based, silicon-based, or phenol-based one can be used. In this preferred embodiment, epoxy-based resin is preferably used. The curing temperature of the above epoxy-based resin is about 150° C., however, when the resin is epoxy-based one, its curing temperature is approximately 80° C. to 200° C., for example.

Further, the material constituting the sealing resin member 4 may include filler. As for the filler, it is not specifically limited, however, suitable inorganic fillers commonly used for resin composition can be used. As for such inorganic fillers, metallic oxide powder such as silica, alumina, magnesia, or calcium oxide, are suitable, for example. The shape of the filler particles may be either spherical or amorphous.

It is preferable for the filler that the maximum filler particle size is larger than the gap between the SAW element 2 and the collective mounting substrate 11, and is about ½ or less, more preferably about ¼ or less of the smaller gap between adjacent SAW elements 2, and the amount of the filler having a particle size larger than the gap between the SAW element 2 and the collective mounting substrate 11 with respect to the total amount of filler is about 5 wt % or more.

Figure 10:
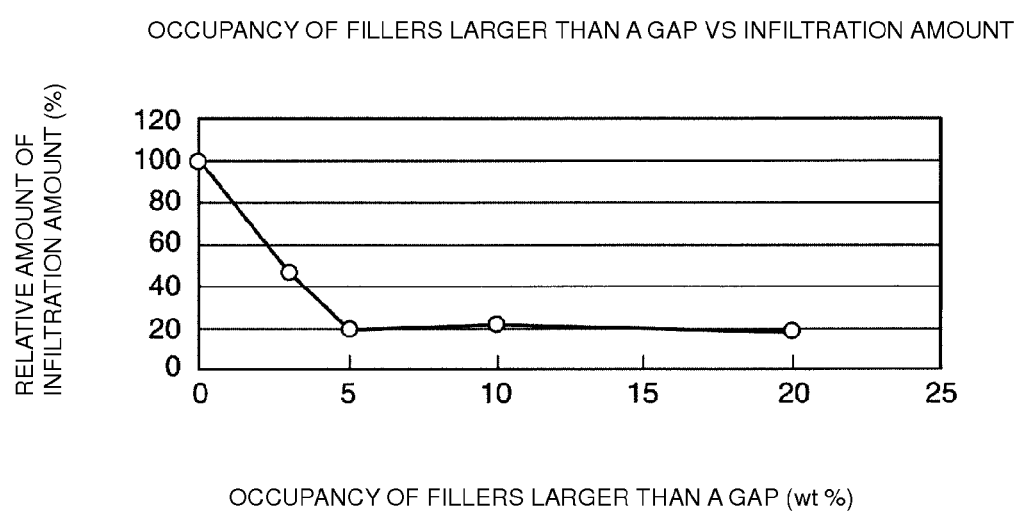
FIG. 10 is a view showing the change of the infiltration amount in the space between the vibration portion of the sealing resin and the packaging substrate when the occupancy of filler particles of a size larger than the gap between the SAW element and the collective mounting substrate with respect to the total amount of filler is changed.

When the particle size of the filler is within the above specified preferable range, the space 5, between the vibration portion 2b and the packaging substrate 1, especially in a region facing the vibration portion 2b, is protected from the infiltration of the sealing resin 4, such that control of the filler ensures the existence of a gap. Accordingly, the propagation of the surface acoustic waves is ensured in the vibration portion 2b on the piezoelectric substrate 2a. Referring to FIG. 10 and Table 1, this will be described on the basis of specific experimental results. FIG. 10 and Table 1 show the change of the infiltration amount of the sealing resin member 4 into the space 5 between the vibration portion 5 and the packaging substrate 1, especially into the region facing the vibration region, when the occupancy of filler with a particle size larger than the gap is changed in manufacturing of the surface acoustic wave device of this preferred embodiment. In addition, in FIG. 10, the infiltration amount is represented by relative infiltration amount (%). The infiltration amount rate of the sealing resin member 4 in the space 5 is defined as 100% if the amount of filler with a particle size larger than the gap is zero wt %, the relative infiltration amount (%) of the infiltration amount is intended to denote the resin infiltration amount rate of 100% in the space 5.

TABLE 1

| occupancy of filler having a particle size larger than gap (wt %) | relative infiltration amount (%) |
| --- | --- |
| 0 | 100 |
| 3 | 47 |
| 5 | 20 |
| 10 | 22 |
| 20 | 19 |

As is clear from FIG. 10 and Table 1, if the amount of the filler with a particle size larger than the gap is set to about 5 wt % or more with respect to the total amount of filler, the infiltration amount of the sealing resin member 4 that infiltrates into the space 5 can be minimized.

The particle size is defined by the size of the sieve openings when the filler is passed through a sieve with sieve openings. The particle size may be defined by a classifier (the difference in scattering due to air, or sedimentation velocity) other than the sieve.

Next, the method of manufacturing the surface acoustic wave device (electronic component) according to this preferred embodiment will be described with reference to FIG. 1A to E, and FIGS. 2 to 4. First, the manufacturing method is a method that includes at least a mounting step, an arranging step, a vacuum (reduced-pressure) packing step, a sealing step, and a dividing step, and the steps being implemented in this order.

First, in the manufacturing method, a step for forming the vibration portion 2b, an electrode pad (not shown), or a wiring pattern to electrically connect both of the parts on the piezoelectric substrate 2a by a lithography process using conductive metal, for example, aluminum, to obtain the SAW element 2, is provided as a pre-step.

After the pre-step, the mounting step is implemented. As shown in FIG. 1A, the mounting step is a step for bonding a plurality of SAW elements 2 on the collective mounting substrate 11 with an external terminal 1c (see FIG. 2) by flip-chip bonding. In the mounting step, depending on the chip size of the SAW element 2, several hundreds to several thousands of SAW elements 2 are mounted in a grid on the collective mounting substrate 11 having an approximate size, for example, 10 cm×10 cm. In this preferred embodiment, the gap between the mounted adjacent SAW elements 2 is preferably about 300 μm in a smaller area, and about 800 μm in a larger area. The gap can be changed as necessary.

Next, in the arranging step, a resin film 12 is arranged on the SAW elements 2 mounted on the collective mounting substrate 11. In this preferred embodiment, the thickness of the resin film 12 is preferably about 250 μm.

Next, in the vacuum packing step, the collective mounting substrate 11, the mounted SAW elements 2, and the resin film 12 are put in a bag 13 for vacuum packaging, and the inside of the bag 13 is deaerated under reduced pressure, for example, at about 500 Pa or less to be hermetically sealed by heat sealing. As for the shape of the bag 13, a bag is listed as being suitable, which has a substantially rectangular shape and an opening formed at one end thereof, the thickness of the bag 13 being preferably about 80 μm.

As for the bag 13, it should be a bag that has at least flexibility, a gas-barrier property, and a heat sealing property, and can contain the collective mounting substrate 11 or the like. For example, a bag having a multi-layered structure is suitable, especially one that is formed of a polyester film with an excellent gas-barrier property and heat resistance withstanding the temperature during heat sealing or curing, for example about 180° C. to about 250° C., as an outer layer, and a polyethylene film with heat sealing property as an inner layer (sealant layer).

Thus, the temperature of the heater 15 for heat sealing to be hereinafter described should exceed the fusing temperature of the inner layer, and therefore, in this preferred embodiment, is preferably about 150° C. to about 200° C. In addition, it may be a bag that can maintain a sealing or hermetically sealing property, instead of the heat sealing property, by fixing with clips or the like.

Moreover, in the multi-layered structure, in order to improve the gas-barrier property, an aluminum layer should be provided as an intermediate layer. As another example of the material for an exterior bag, polyimide and polyamide with excellent heat resistance are listed as being suitable. As another example of the material for an interior bag, polypropylene-based materials with a heat sealing property are listed as being suitable.

Figure 3:
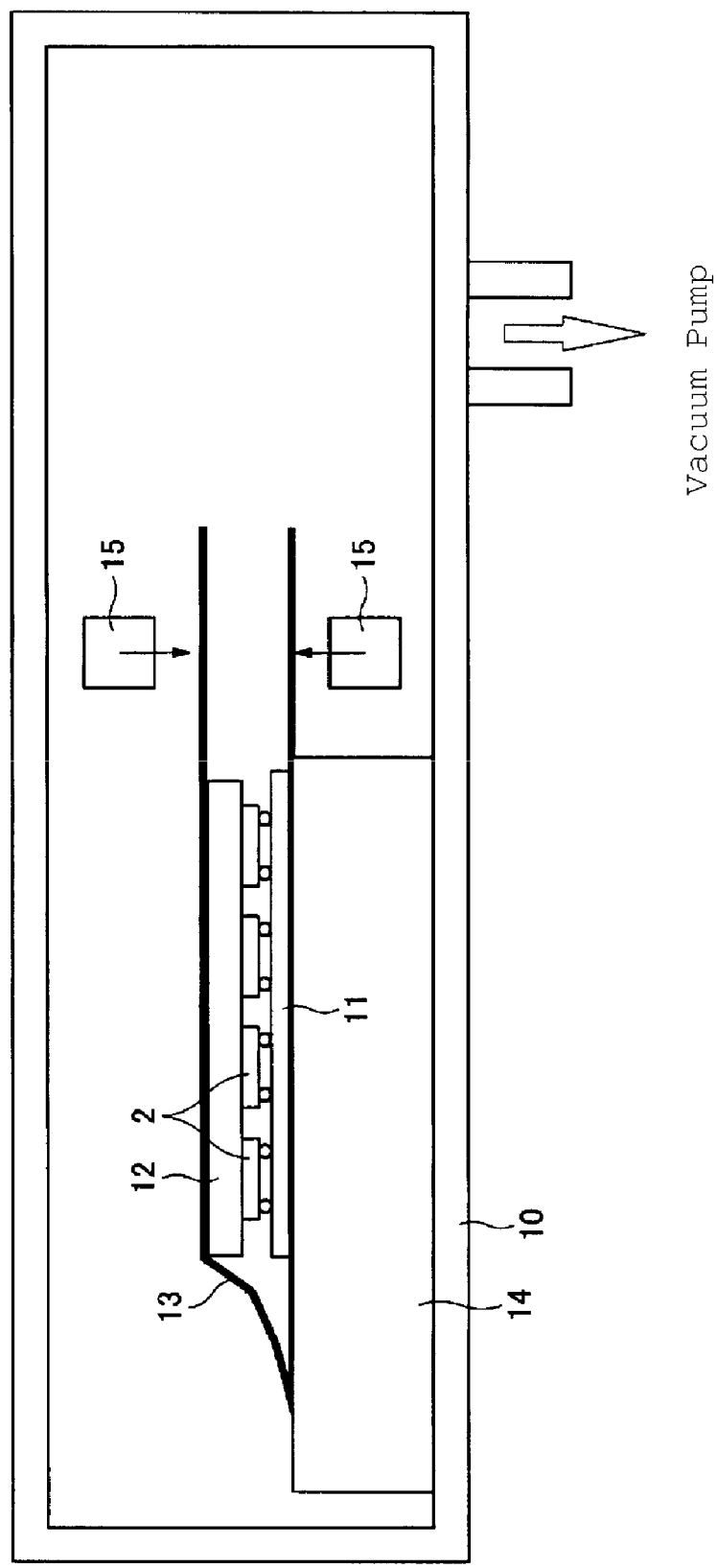
FIG. 3 is a schematic constitution view showing a vacuum packing step in a preferred embodiment of the present invention.

As shown in FIG. 3, during the hermitical sealing, the bag 13 into which the collective mounting substrate 11, the SAW elements 2, and the resin film 12 have been placed, is placed on a placing bed 14 within a hermetically sealed container 10. The inside of the bag 13 is deaerated by a vacuum pump so that the inside of the container 10 enters a vacuum state (for example, about 500 Pa or less), and the surrounding area of the opening of the bag 13 is fused by a fusing heater (heat sealer) 15 from the both sides to close the opening. As for the vacuum state (under reduced pressure), it should be of a pressure smaller than a pressure present in a pressurized state or a reduced pressure in the curing step to be hereinafter described, however, it is preferable to be about 500 Pa or less.

Figure 1B:
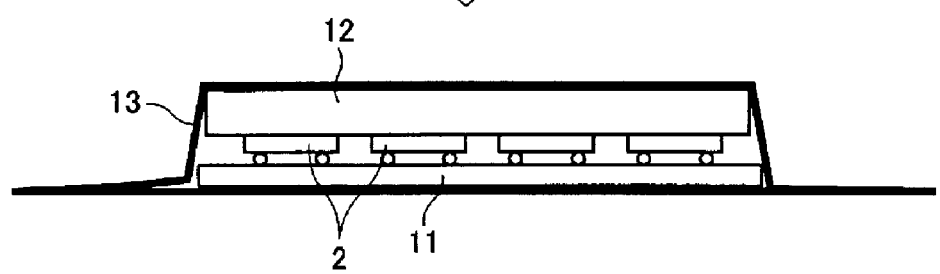

When the closed bag 13 is taken out into the atmospheric pressure from the hermetically sealed container 10, as shown in FIG. 1B, the bag 13 enters a state in which the bag 13 contacts the outsides of the collective mounting substrate 11, the SAW elements 2, and the resin film 12 due to the pressure difference.

In addition, as for a process other than the hermetically sealing process, a process is listed as being suitable that deaerates the inside of the bag 13 by inserting a metal pipe connected to a vacuum pump into the opening of the bag 13 in an air-tight manner. In this case, the portions of the opening facing each other also closely contact each other, and the opening should be closed by fusing the surrounding area of the opening by a heat fusing heater (heat sealer) 15 while pulling out the metal pipe in this state.

Figure 1C:
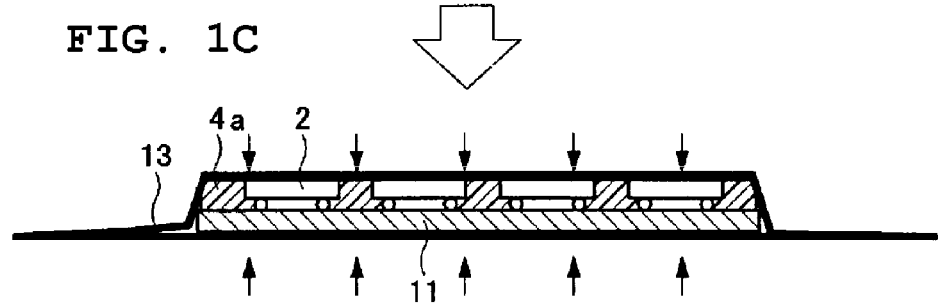

Subsequently, the sealing step is implemented, which includes an infiltrating step and a curing step. As shown in FIG. 1(c), in the infiltrating step, the resin film 12 is softened by being heated together with the bag to a temperature, for example, below the curing temperature of the resin film 12, in this preferred embodiment below about 150° C., or about 100° C. to about 140° C.

Thereby, the softened resin film 12 is caused to infiltrate between the individual SAW elements 2 mounted on the collective mounting substrate 11 vacuum packed inside the bag 13 via the pressing force due to the pressure difference between the inside and the outside of the bag 13. As a result, the SAW elements 2 are covered with the sealing resin precursor 4a formed from the resin film 12 and sealed.

At this time, the top of the resin film 12 is kept substantially parallel with the collective mounting substrate 11 due to the tensile force of the bag 13, and becomes almost planar when the infiltration is completed.

Figure 1D:
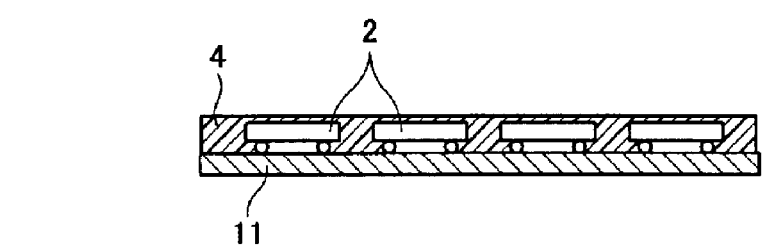

Next, in the curing step, the SAW elements 2 and the collective mounting substrate 11 are further heated to the curing temperature of the sealing resin precursor 4a formed from the resin film 12, about 150° C. in this preferred embodiment, and the sealing resin precursor 4a is cured. As the result, as shown in FIG. 1D, the sealing resin member 4 covering the SAW elements, is formed.

Figure 4:
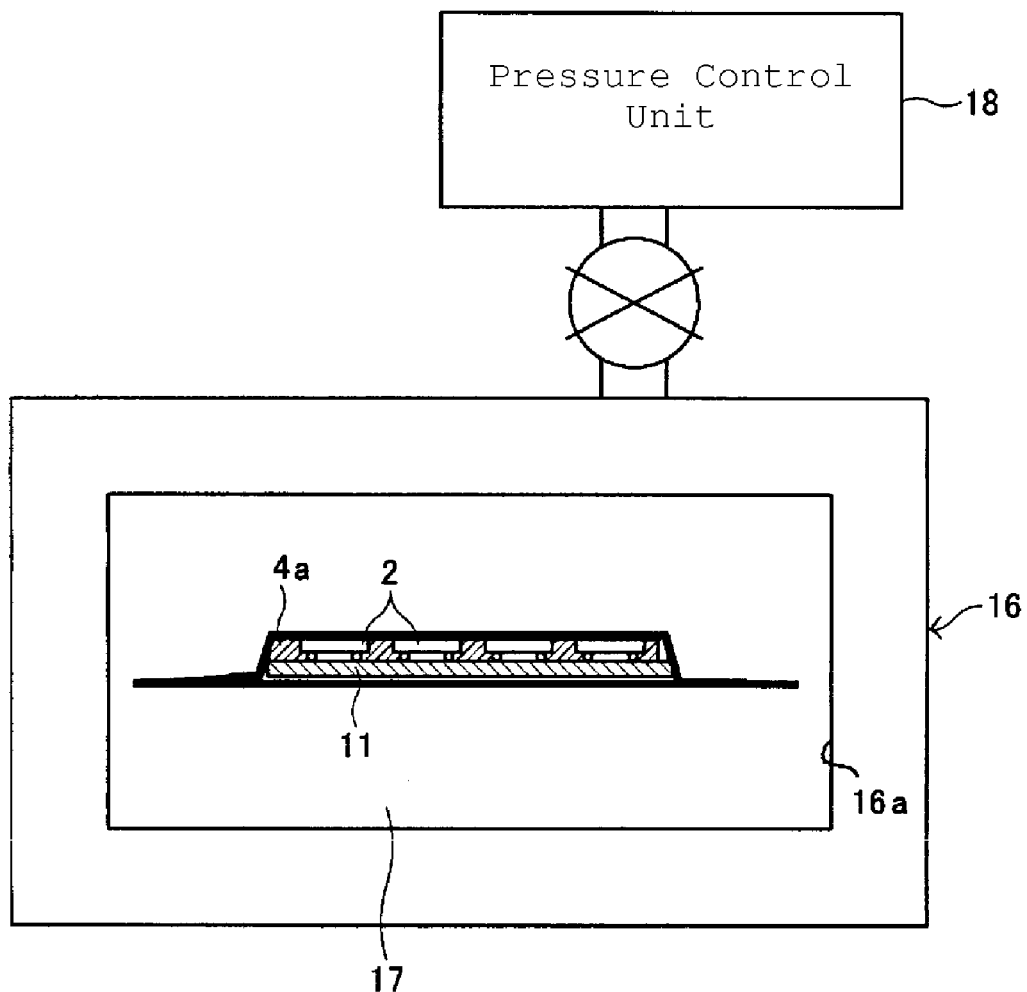
FIG. 4 is a schematic constitution view showing a curing step in a preferred embodiment of the present invention.

As shown in FIG. 4, in the curing step, the collective mounting substrate 11, the SAW elements 2, and the sealing resin precursor 4a, vacuum packed inside the bag 13, are placed within an inner space 16a of a hermetically sealed container 16. Here, it is preferable to apply a pressure to the bag 13 in the inner space 16a via a pressurized medium 17 whose pressure is controlled by a pressure control unit 18 via the phenomenon of equal pressure application. As for the pressurized medium, air, water, oil, and the like may be used. The pressure control may be implemented by any process, as long as a suitable pressure can be applied to the bag 13 under vacuum. The pressure regulation may be either pressurization that causes the pressure to be higher than atmospheric pressure, or depressurization that causes the pressure to be lower than atmospheric pressure.

According to the curing step, if the space 5 is adequately formed below the SAW elements 2, or if, using a high-viscosity resin, the sealing resin member 4 is also intended to be infiltrated between the SAW element 2 and the collective mounting substrate 11, the pressure applied on the sealing resin precursor 4a through the bag 13 should be controlled by regulating the surrounding pressure during curing. Since such a pressure control can be implemented, the tolerance level with respect to the aspect or shape of the sealing resin member 4 becomes wider. The shape or size of the space 5 can also be easily controlled.

In the sealing resin member 4 cured by such a curing step, a concave portion with a depth of the order of several μm occurs at the border line between the adjacent SAW elements. However, the concave portion does not cause any special problem during the dividing step to be described hereinafter. In order to avoid the occurrence of the concave portion, the thickness of the resin film 12 to be used preferably should be larger.

Figure 1E:
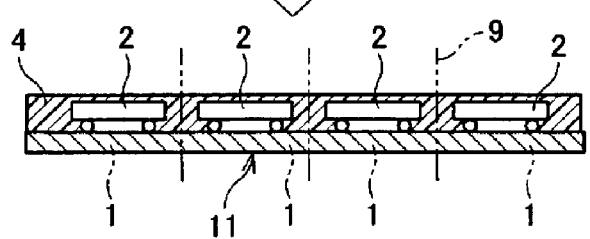
Figure 2:
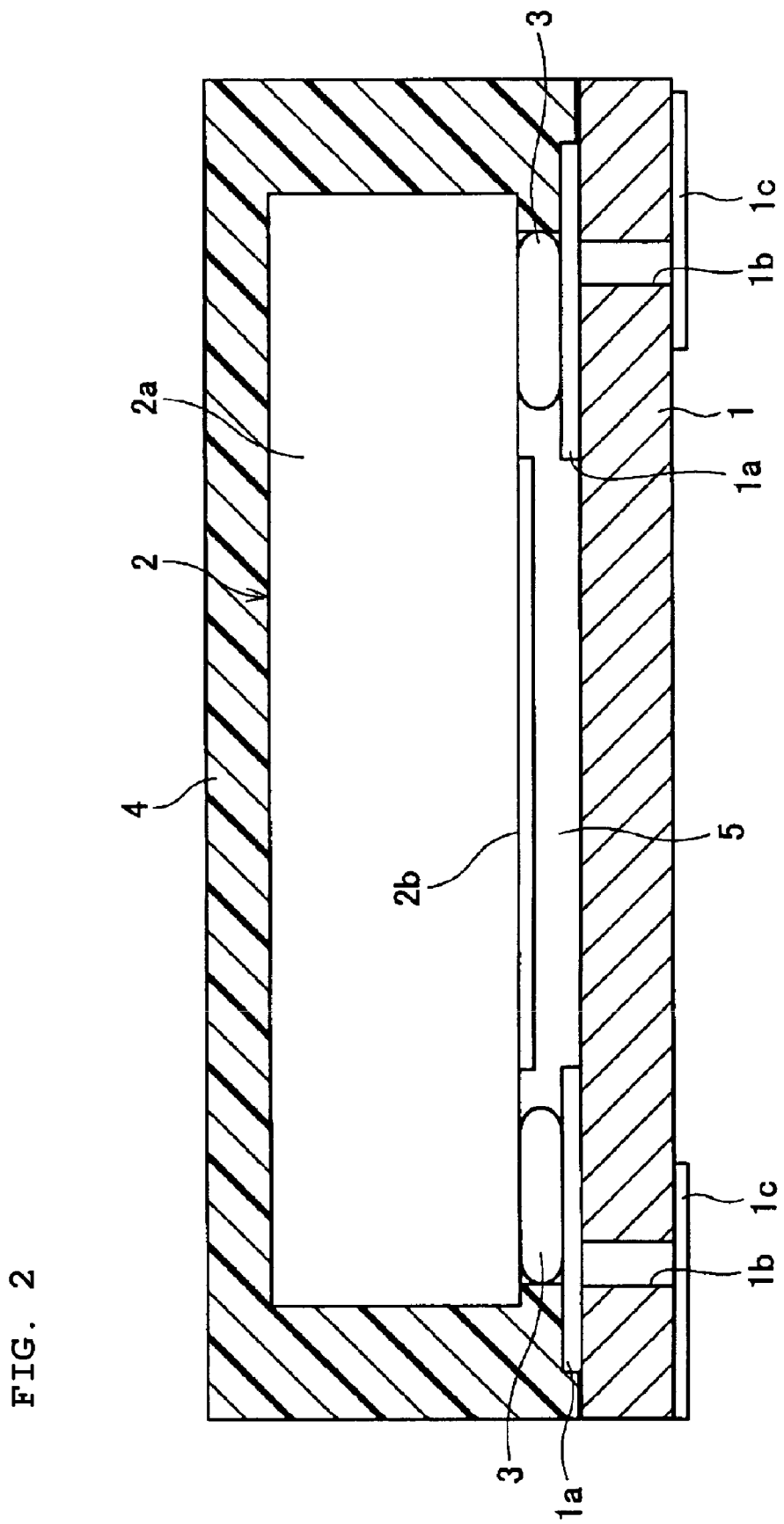
FIG. 2 is a sectional view of a SAW device as an electronic component used in a preferred embodiment of the present invention.

Thereafter, in the above mentioned dividing step, the SAW elements 2 resin-sealed by the sealing resin member 4 are taken out from the bag 13, and as shown in FIG. 1E, the collective mounting substrate 11 is divided into individual SAW elements 2 along virtual cut lines 9 by a suitable process, for example, a dicing process, cutting/breaking, or the like.

As mentioned above, in the manufacturing method of a preferred embodiment of the present invention, the SAW elements 2 are sealed by superposing the SAW elements 2, the collective mounting substrate 11, and the resin film 12 on each other, and subjecting them to vacuum packing via the bag 13, and then, the softened resin film 12 is cured. Thereby, since the air within the bag 13 is discharged, a lamination CSP-type SAW device in which voids do not occur, can be obtained.

In the manufacturing method, apparatuses to be used are only a simple vacuum packing machine and a small heating oven. Thus, using one collective mounting substrate 11 while avoiding the occurrence of the voids, several hundreds to several thousands of SAW devices can be manufactured in one batch and at a low cost.

In addition, when a resin film having filler with a small particle size and a resin with low elasticity are used to form the resin film 12, the resin can also be caused to infiltrate the gap between the SAW element 2 and the collective mounting substrate 11.

Moreover, if, as in a SAW device including a SAW filter, a vibration space is required between the collective mounting substrate 11 and the SAW element 2, it is preferable to use a resin film 12 having fillers with a maximum particle size larger than the gap between the collective mounting substrate 11 and the SAW element 2, and high elasticity during softening. Thereby, it is possible to adequately form a space 5 between the collective mounting substrate 11 and the SAW element 2. In addition, by suitably setting the thickness of the resin film 12 to be used, the production thickness of the obtained SAW device can be controlled.

Hereinafter, the effects of the manufacturing method according to the present preferred embodiment will be described.

In the manufacturing method, by using a simple vacuum apparatus and a simple technique, sealing can be implemented at a high productivity rate and at a low cost, and, by using an atmospheric pressure, the entire surface of the bag 13 can be evenly depressed. Accordingly, the manufacturing method is negligibly affected by the thickness variation of the collective mounting substrate 11 or the SAW element 2 as compared with a roller technique or a press technique.

Further, in the manufacturing method, it is not required to form many holes for vacuuming, thus enabling a compact size, and the sealing resin precursor 4a formed from the resin film 12 is pushed slowly between the SAW elements by atmospheric pressure, thus the SAW elements to be products are not subjected to temperature or pressure that is greater than required. Therefore, it is possible to prevent pyroelectric breakdown among SAW elements, conductive defects of portions of the bump electrodes 3, chips among SAW elements, or the like.

Moreover, in the manufacturing method, the entire surfaces of the SAW elements can be covered with the sealing resin member 4, thus enabling a sufficient sealing thickness. Accordingly, in the manufacturing method, sealing property can be improved as compared with the case using a thin film, and, at the same time, the surface areas of the packaging substrate 1 and the top of the sealing resin member 4 can be caused to be substantially equal to each other. Thus, it is easy to ensure the mountability of the obtained SAW device.

Next, another preferred embodiment according to the present invention will be described. In the arranging step, the entire surface of one side of the resin film 12, the entire outer surface, may be adhered with a parting sheet 19. As for the material of the parting sheet 19, a material should be used that has heat resistance equal to that of the outer layer of the bag 13 or more, and small affinity, or adhesiveness, to the inner layer of the bag 13 or the sealing resin member 4. For example, PET (polyethylene phthalate) or the like is suitable.

Figure 5:
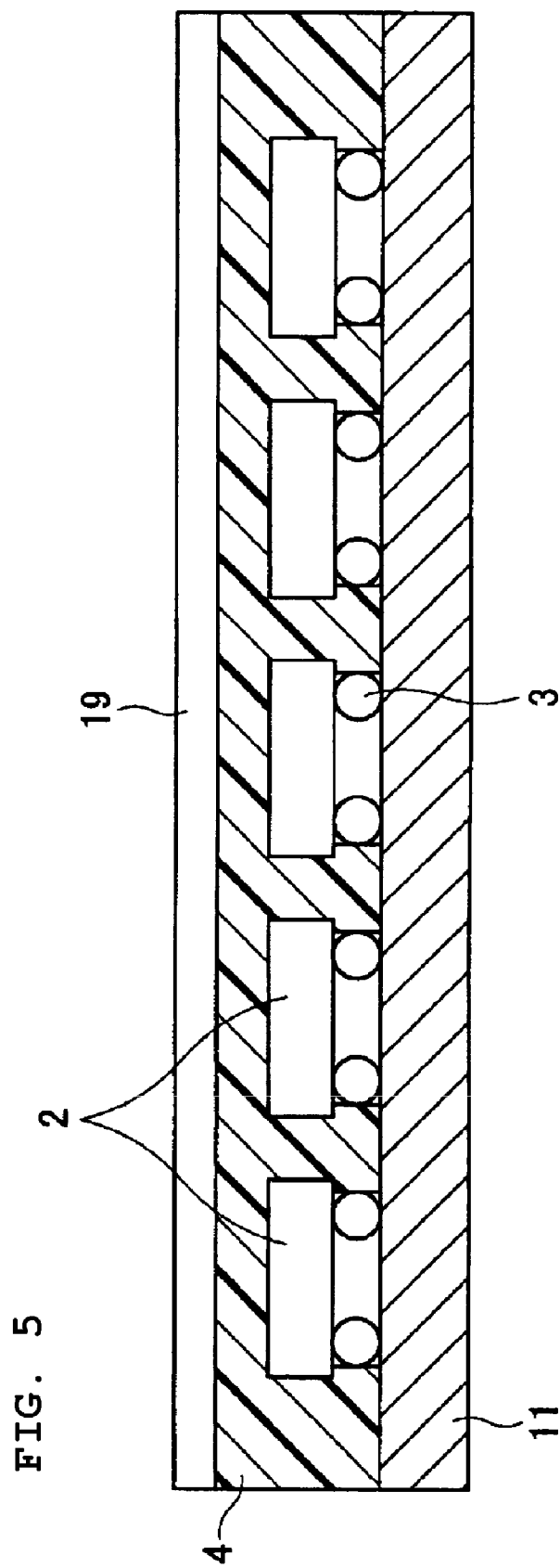
FIG. 5 is a sectional view showing a step of the manufacturing method according to another preferred embodiment of the present invention.

In this case, as shown in FIG. 5, after forming the sealing resin member 4 by softening and curing the resin film 12, the parting film 19 is released. Accordingly, adhesion of contaminants such as dirt adhering to the surface of the sealing resin member 4 or occurrence of unevenness during the curing procedure can be prevented, and even if heated to the curing temperature, it is possible to prevent the inner layer of the bag 13 and the sealing resin member 4 from adhering to each other, thus, enabling the manufacturing steps to be simplified.

Moreover, since the surface roughness of the parting film 19 at the resin film 12 side is transferred to the surface of the sealing resin member 4 formed from the resin film 12, a package top of the sealing resin member 4 with a good surface condition can be obtained, thus, enabling good laser printing to the package top without a preliminary treatment.

Figure 6:
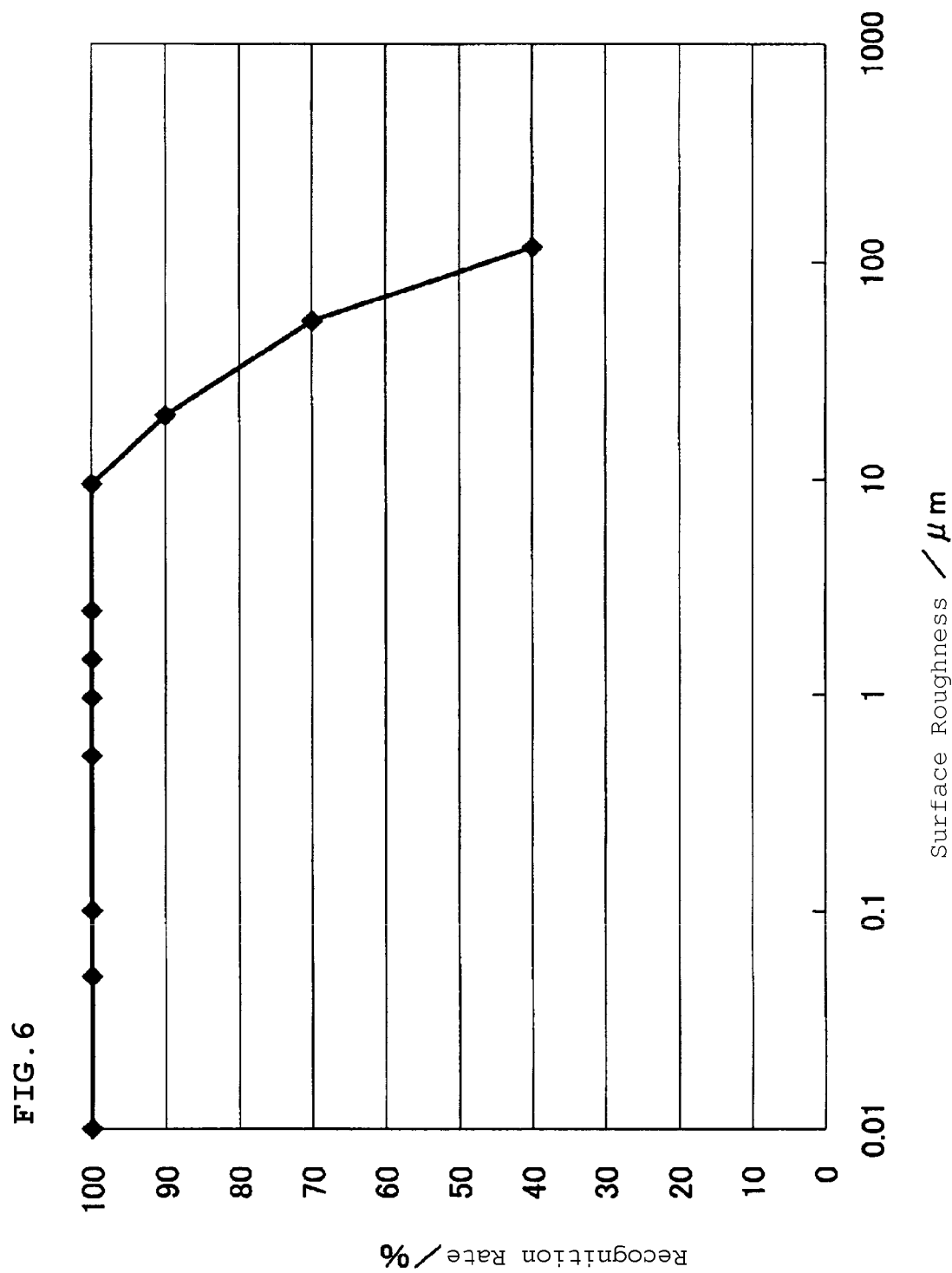
FIG. 6 is a graph showing the relationship between the surface roughness of the top of the sealed resin of a SAW device as an electronic component used in a preferred embodiment of the present invention and the recognition rate for the laser printing on the top.

In addition, when the relationship between the surface roughness (μm) of the package top of the sealing resin member 4 and the recognition rate in the laser printing (%) was investigated by variously changing the surface roughness, results as shown in FIG. 6 were obtained. In addition, the value of the surface roughness is a value measured using a non-contact three dimensional surface roughness measuring machine. Thereby, it is understood that it is preferable for the surface roughness of the resin film 12 side of the parting sheet 19 to be within a range of about 0.01 μm to about 10 μm, for example.

On the other hand, there is a situation in which an electronic component such as the SAW element 2 or a semiconductor element 22 is bonded on the packaging substrate or a package by facedown bonding, and the surroundings are sealed with the sealing resin member. In such a situation, after being cured, when a lot number or a mark of the product is printed on the sealing resin member 4, the printing can not be implemented clearly due to the unevenness or the presence of contaminants on the surface of the sealing resin member 4. In the related art, as a countermeasure, a process in which after further coating a printing resin with a color developing property on the sealing resin member, the laser printing was implemented, has been used. As a result, there has been a problem that the additional steps resulted in an increase in cost.

In order to address such problems, the SAW elements 2 bonded on the collective mounting substrate 11 by face down bonding should be covered with the resin film 12, and, further the parting sheet 19 should be placed on the resin film 12 to soften and cure the resin film 12. Thereby, the unevenness and contamination of the surface (top) of the sealing resin member 4 formed from the resin film 12 can be prevented from occurring during curing.

Thereby, it is possible to directly implement laser printing on the sealing resin member 4 without subjecting the sealing resin member 4 to a special processing, thus, enabling cost reduction while ensuring impressibility.

Figure 7:
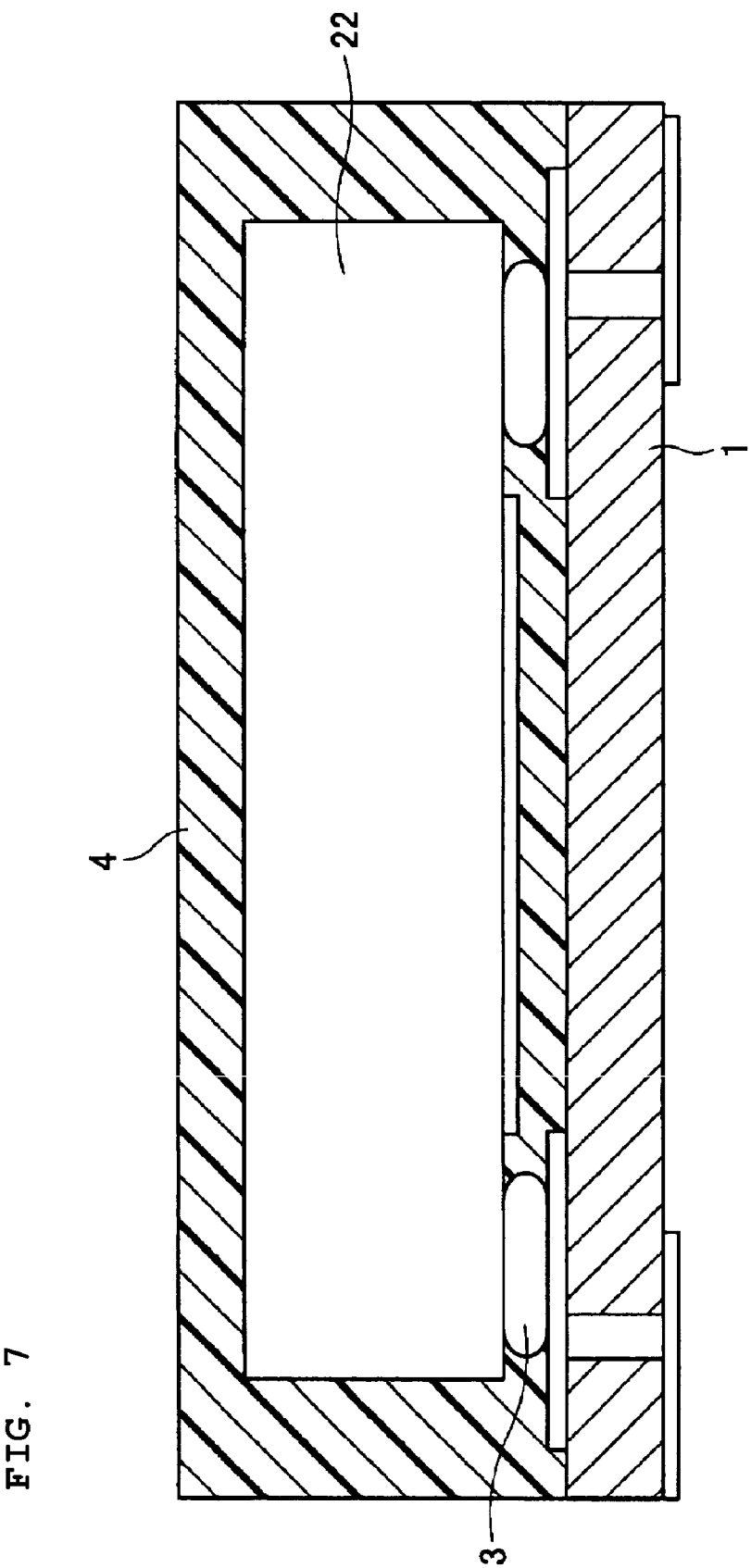
FIG. 7 is a sectional view showing another example of the electronic component used in a preferred embodiment of the present invention.

In addition, although in the present preferred embodiment, as an electronic component, an example of the SAW element was described, the electronic component is not limited to the above-described preferred embodiment. Instead, for example, as shown in FIG. 7, the semiconductor element 22 may be used instead of the SAW element 2. If the semiconductor element 22 is used, since it is not required to ensure the existence of the space 5 shown in FIG. 2, the space 5 may be filled with the sealing resin member 4 as an underfilling material.

Figure 8:
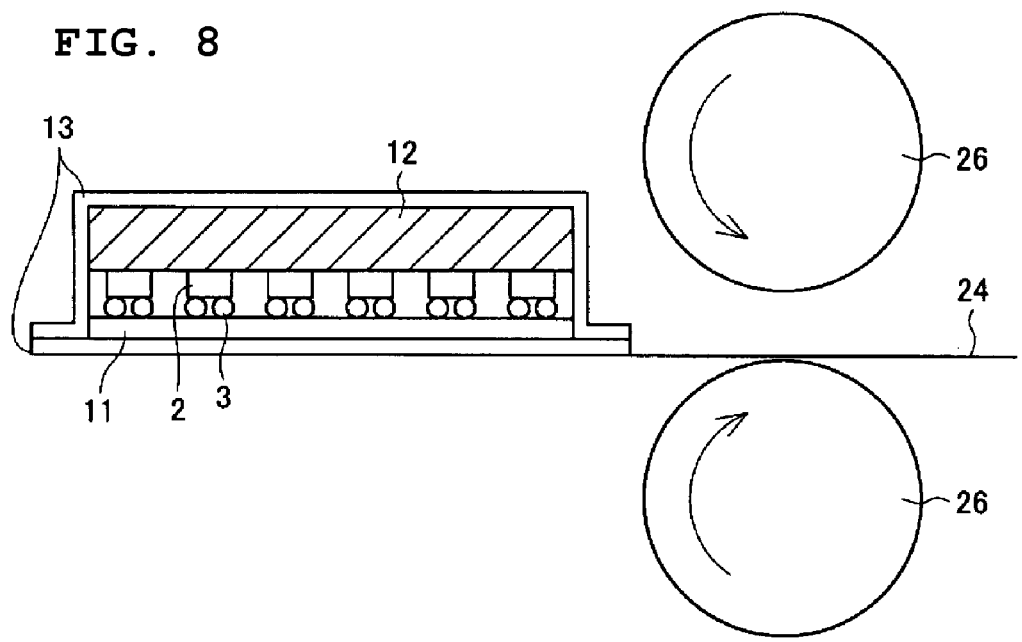
FIG. 8 is a schematic constitution view showing another example of the infiltrating step according to a preferred embodiment of the present invention.

Moreover, in the infiltrating step, an example using pressurization by atmospheric pressure to the reduced pressure within the bag, was described, however, as shown in FIG. 8, heating and pressing rollers 26 may be used. Thus, the infiltrating step is intended to be implemented by placing the resin film 12 on the SAW elements 2 mounted on the collective mounting substrate 11 through the bump electrodes 3, placing the contents contained within the bag 13 on a flat plate 24, and transferring the bag 13 together with the flat plate 24 between the two heating and pressing rollers 26, 26.

Figure 9:
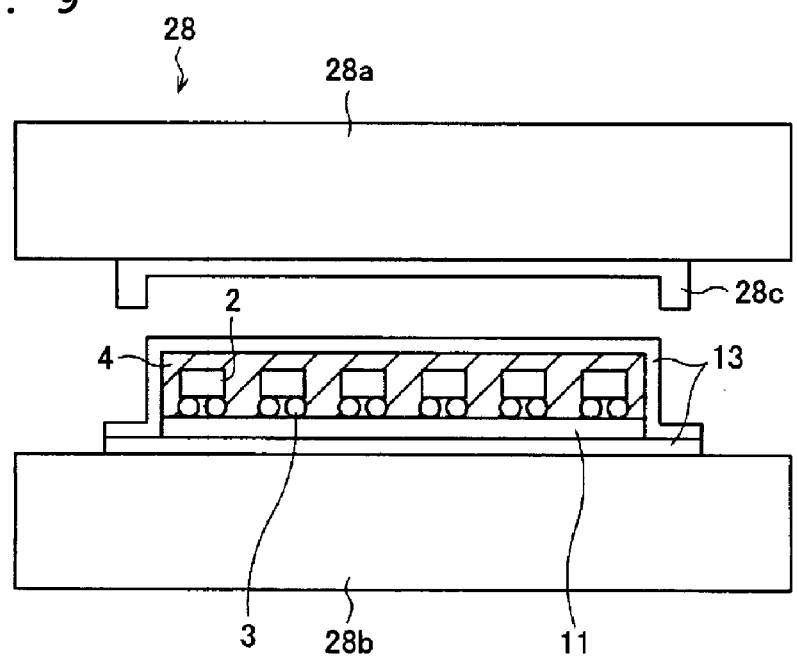
FIG. 9 is a schematic constitution view showing still another example of the infiltrating step according to another preferred embodiment of the present invention.

Moreover, as shown in FIG. 9, pressurization by inserting the bag 13 in a press frame 28c of a press machine 28 may also be used. The infiltrating step using the above-described pressurization is a process in which the bag 13 containing the collective mounting substrate 11, the SAW elements 2, and the resin film 12, are placed on the lower bed 28b of the press machine 28, and the resin film 12 is buried by pressing the bag using a tool such as the press frame 28c attached to the rear surface of the upper press 28a, while the resin film 12 is heated from above by processing the upper press 28a, to form the sealing resin member 4 from the resin film 12.

Further, during the vacuum packing step, in order to deaerate air effectively from the gap between the resin film 12 and the collective mounting substrate 11, a spacer should be placed so as to form a gap between the surroundings of the collective mounting substrate 11 and the bag 13 that is an adhesive film, to provide an air hole (air path).

Moreover, a portion of the collective mounting substrate 11 or a portion of the thermally softened adhesive resin film 12 may be provided with the air hole. In order to ensure the adhesiveness via atmospheric pressure after vacuum packing step, the air hole should be opened anywhere of the space formed between the resin film 12 and the collective mounting substrate 11.

Moreover, in the vacuum packing step, after replacing the contents of the bag 13 with inert gas such as dry nitrogen, deaeration may be implemented further. Moreover, as for the process for hermetically sealing the bag 13, thermal fusioning is preferable, however, any process that can block entry of the surrounding air, such as adhesion or contact bonding using a tool may be used.

Moreover, if a space 5 is formed under the SAW element 2, in order to minimize the infiltration amount of the sealing resin member 4, sealing should be implemented with suitable residual air left by regulating the degree of vacuum during vacuuming. As for the degree of vacuum at this time, it differs depending on the volume of the space 5 to be formed or the shape of the product, however, it is preferable to be about 100 Pa to about 500 Pa, for example.

In this manner, by causing the residual air to be left, namely, by controlling the air amount during dearation of the inside of the bag 13, effects similar to those of the disclosed preferred embodiments can be attained, and a repulsive force occurs within the space 5 during sealing, thus causing the space 5 to be formed easily.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method of manufacturing an electronic component comprising the steps of:
   a mounting step including mounting on a collective mounting substrate a plurality of electronic functional elements, each of the plurality of electronic functional elements having a substrate and an electronic functional portion provided on the substrate;
   an arranging step including arranging a resin film on the electronic functional elements mounted on the collective mounting substrate;
   a reduced-pressure packaging step including putting the electronic functional elements and the resin film mounted on the collective mounting substrate in a bag that has a gas-barrier property, and hermetically sealing the contents inside the bag by closing an opening of the bag after depressurizing the inside of the bag;
   a sealing step including sealing the electronic functional elements with a sealing resin member formed from the resin film by causing the resin film to infiltrate between the electronic functional elements mounted on the collective mounting substrate with no reducing pressure being applied in the bag after hermetically sealing the contents inside the bag; and
   a dividing step including dividing the collective mounting substrate having the resin-sealed electronic functional elements into individual electronic functional elements.

2. The method of manufacturing an electronic component according to claim 1, wherein the sealing step includes a curing step causing the resin film to infiltrate between the electronic functional elements, heating the electronic functional elements and the collective mounting substrate covered with a sealing resin precursor formed from the resin film, and curing the sealing resin precursor to obtain the sealing resin member, and the curing step includes performing heating in a pressure-controlled hermetically sealed space.

3. The method of manufacturing an electronic component according to claim 1, wherein, the electronic functional element is a surface acoustic wave element having a vibration portion as the electronic functional portion disposed on a piezoelectric substrate.

4. The method of manufacturing an electronic component according to claim 3, wherein, in the mounting step, the vibration portion is arranged so as to have a space between the vibration portion and the collective mounting substrate and so as to face the collective mounting substrate.

5. The method of manufacturing an electronic component according to claim 4, wherein the resin film includes filler and a maximum particle size of a particle distribution of the filler is larger than a gap between the electronic functional element and the collective mounting substrate, and an amount of the filler having a particle size larger than the gap between the electronic functional element and the collective mounting substrate is about 5 wt % or more with respect to the total amount of filler.

6. The method of manufacturing an electronic component according to claim 1, wherein, the sealing step further includes heating the resin film to soften the resin film and for applying pressure to the resin film via a roller or a press machine.

7. The method of manufacturing an electronic component according to claim 1, wherein, the arranging step includes adhering a parting sheet on one surface of the resin film, and arranging the resin film on the collective mounting substrate having the electronic functional elements thereon so that the parting sheet side of the resin film faces outside.

8. The method of manufacturing an electronic component according to claim 7, wherein, the surface roughness of the resin film side of the parting film is in the range of about 0.01 µm to about 10 µm.

9. The method of manufacturing an electronic component according to claim 1, wherein, the mounting step includes a flip-chip bonding step for mounting the plurality of electronic functional elements through bumps by flip-chip bonding.

10. The method of manufacturing an electronic component according to claim 1, wherein, the bag has a multi-layered structure having a thermoplastic resin layer as an innermost layer and a heat-resistant resin layer with a higher heat resistance and gas-barrier property that is higher than those of the thermoplastic resin layer as an outermost layer.

* * * * *